United States Patent [19]

Conroy-Wass

[11] Patent Number: 4,713,014
[45] Date of Patent: Dec. 15, 1987

[54] QUICK-RELEASE MULTI-MODULE TERMINATING ASSEMBLY

[75] Inventor: Theodore R. Conroy-Wass, Colton, Calif.

[73] Assignee: Hughes Aircraft Company, Los Angeles, Calif.

[21] Appl. No.: 946,551

[22] Filed: Dec. 23, 1986

[51] Int. Cl.⁴ .................. H01R 9/07; H01R 13/631
[52] U.S. Cl. .................. 439/67; 108/147; 439/260
[58] Field of Search ............ 339/17 F, 75 M, 75 MP, 339/176 MF; 29/837, 839, 840, 872, 873; 324/73 PC, 158 P, 158 F; 200/292; 108/147; 439/67, 77, 260

[56] References Cited

U.S. PATENT DOCUMENTS

| 149,255 | 3/1874 | Semmendinger | 108/147 |
| 3,007,997 | 11/1961 | Panariti | 29/839 |
| 3,610,171 | 10/1971 | Soman | 108/147 |
| 4,125,310 | 11/1978 | Reardon, II et al. | 339/17 F |
| 4,435,740 | 3/1984 | Huckabee et al. | 339/17 F |
| 4,453,795 | 1/1984 | Moulin | 339/92 M |
| 4,540,227 | 9/1985 | Faraci | 339/17 F |
| 4,551,914 | 11/1985 | Stiggelbout | 29/837 |

FOREIGN PATENT DOCUMENTS

| 2455372 | 12/1980 | France | 339/75 MP |
| 57-97464 | 6/1982 | Japan | 324/158 F |

OTHER PUBLICATIONS

Hughes Drawings, SKO4864; SKO4864-01, 02, 08, 09, 58; SKO5115.

*Primary Examiner*—Neil Abrams
*Attorney, Agent, or Firm*—Joseph E. Szabo; Anthony W. Karambelas

[57] ABSTRACT

A quick-release interfacing assembly (165) comprising first and second carriers (53, 53a), a plurality of module assemblies (11) carried by the first and second carriers (53, 53a) and a coupling (73, 75) for joining the first and second carriers (53, 53a) together to form a double cartridge assembly (71). A panel receiver (91) receives the double cartridge assembly (71) and couples the double cartridge assembly (71) to a test device. Each of the module assemblies (11) includes a connector body (13), a pressure member (27), and a flexible sheet (17) carrying contacts (21, 23) thereon.

51 Claims, 17 Drawing Figures

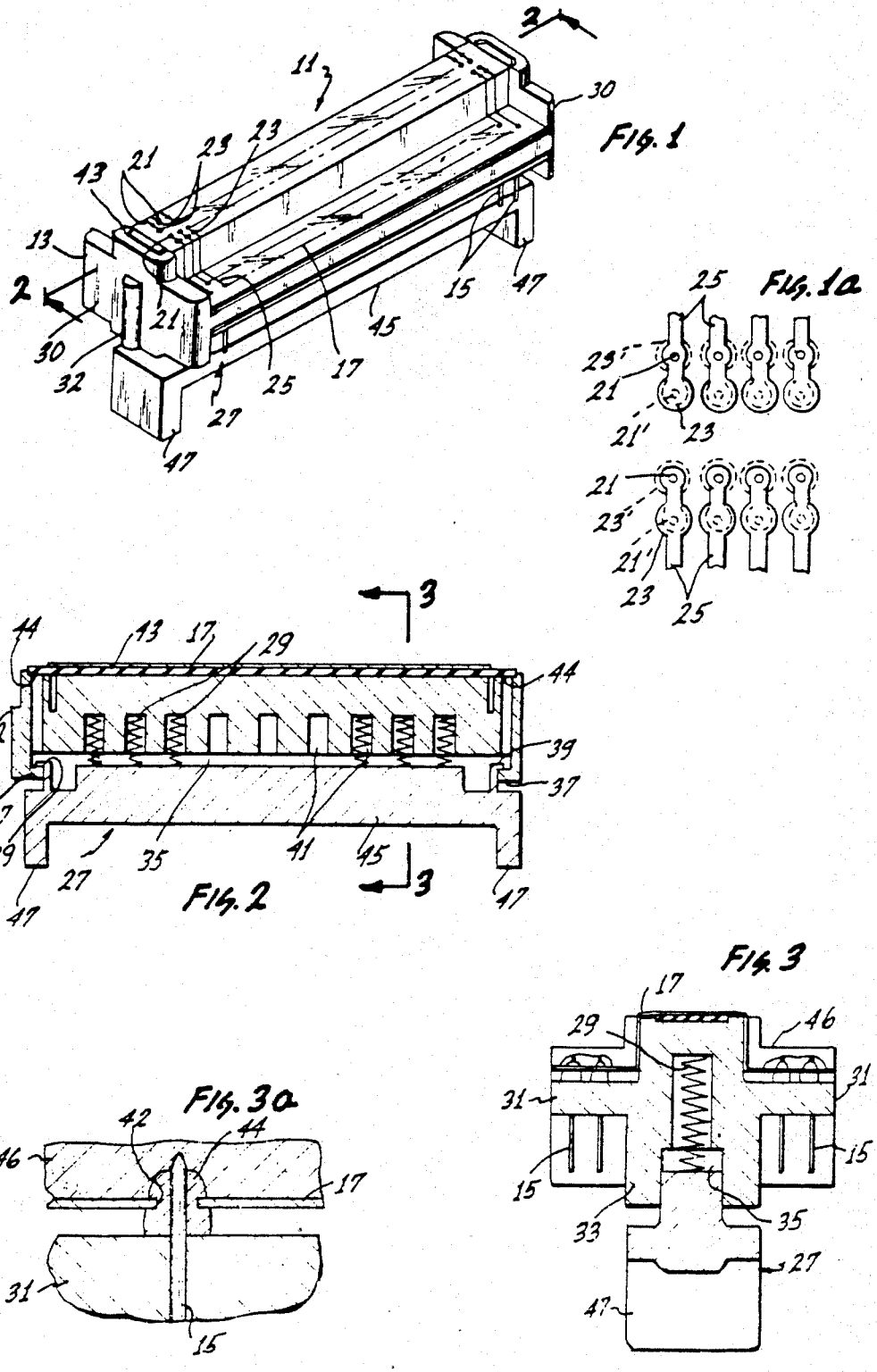

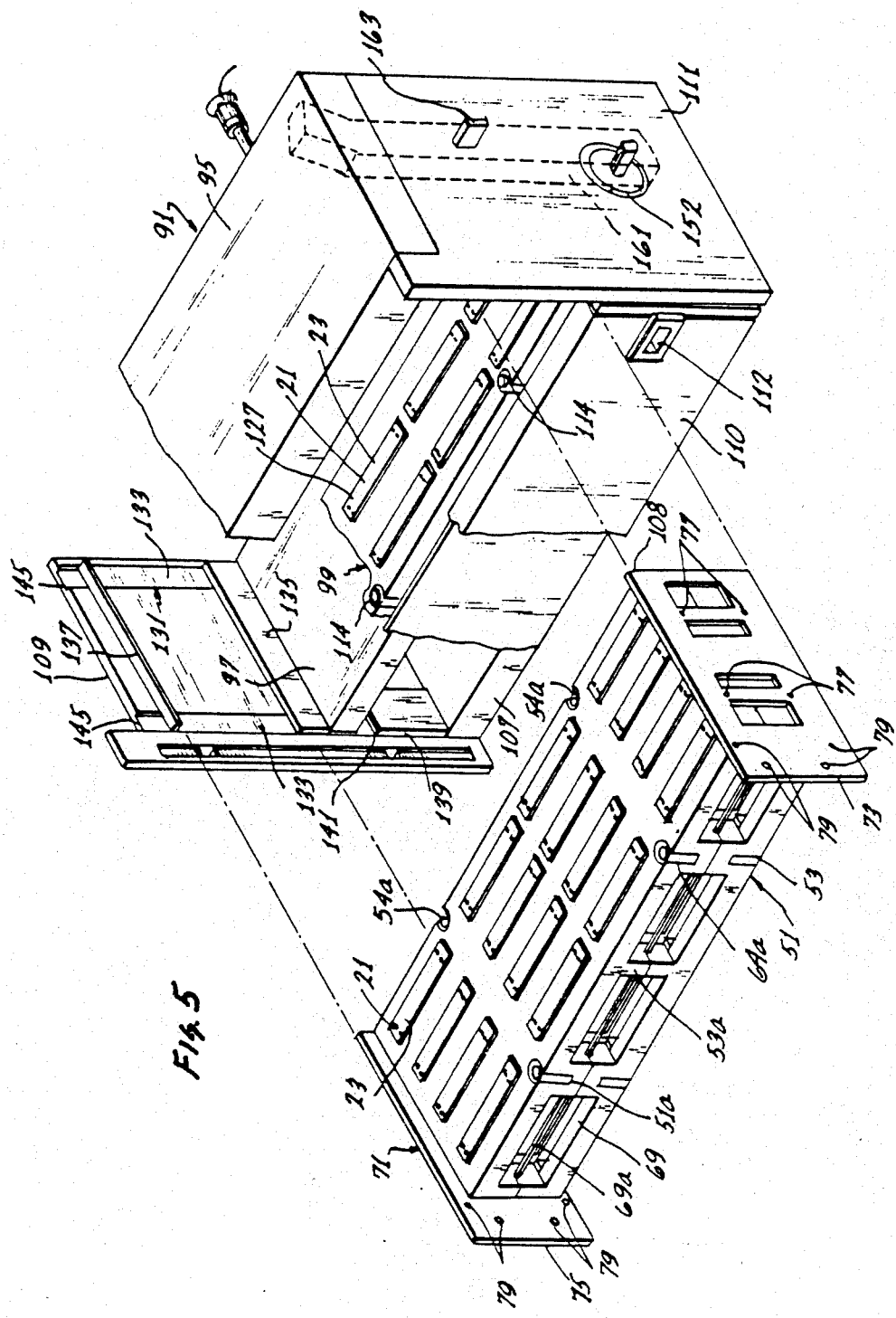

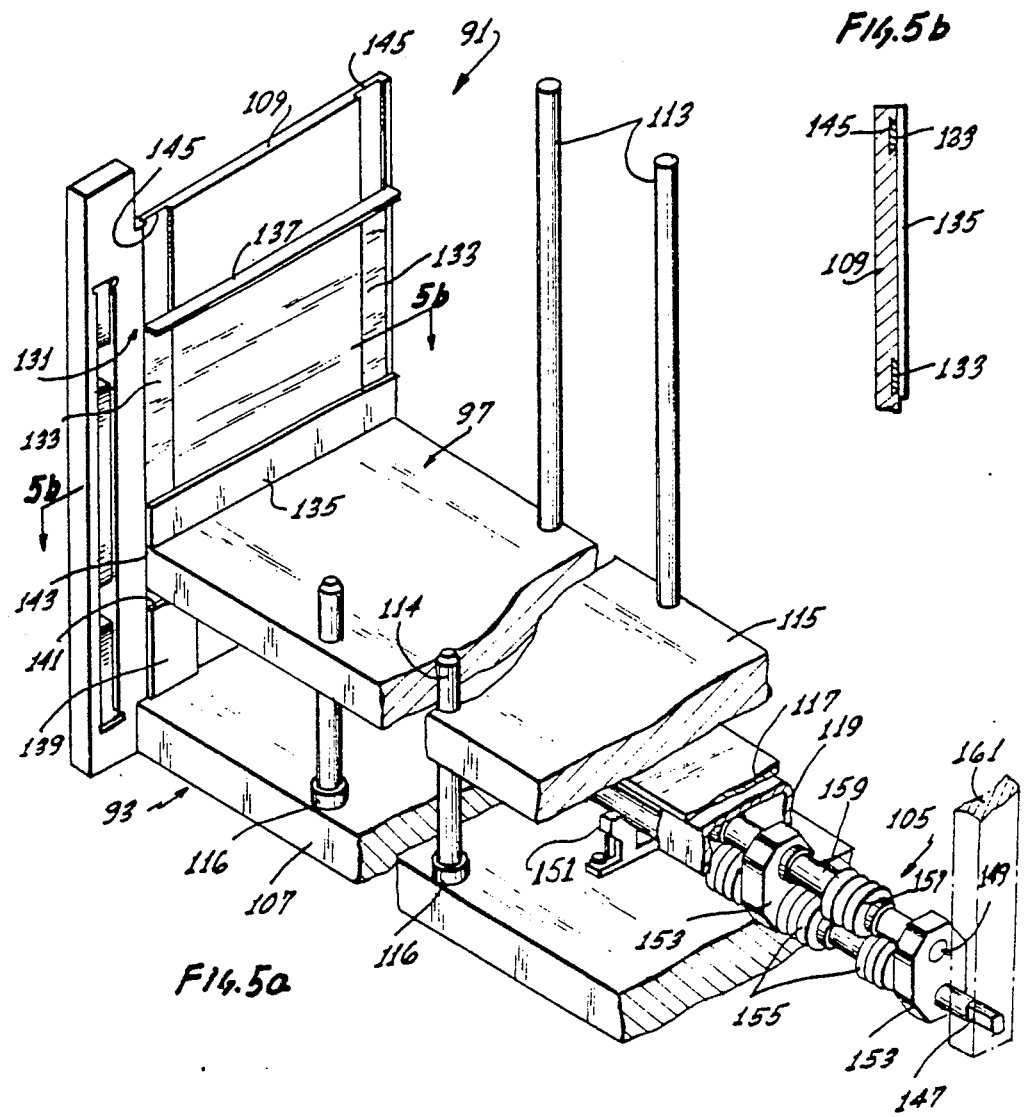

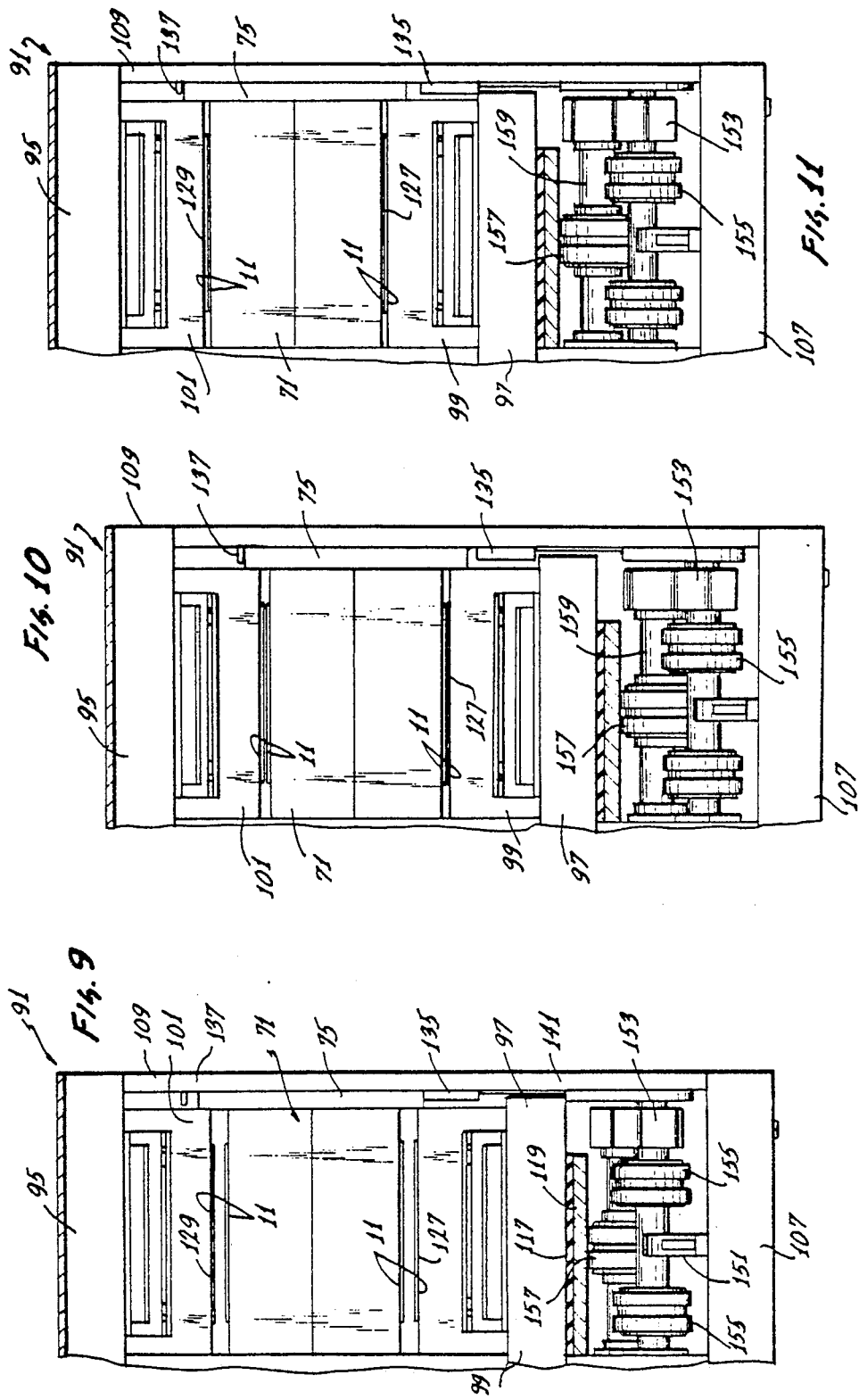

QUICK-RELEASE MULTI-MODULE TERMINATING ASSEMBLY

BACKGROUND OF THE INVENTION

1. Field of the Invention

This invention relates to an assembly and components thereof useful in coupling electronic apparatus, such as radar equipment and aircraft radios, to a test device, such as a computer, for testing the electronic apparatus.

2. Description of Related Art

In electronically testing various electronic apparatuses, such as radar and aircraft radios, it is necessary to couple the electronic apparatus to a suitable test device, such as a computer. Because the circuitry of the electronic apparatus is typically complex, it is necesasry to couple a large number of contacts between the electronic apparatus and the test device in order that the electronic tests can be carried out.

To accomplish this, it is known to connect the electronic apparatus to the contacts of an appropriate cartridge assembly and to insert the cartridge assembly into a cam-actuated panel receiver. By rotating of the cams, a table is elevated to bring the contacts of the panel assembly into engagement with an array of contacts carried by the panel receiver. This array of contacts is in turn coupled to the test device. Accordingly, by elevating the table and bringing these contacts into engagement, the electronic apparatus under test can be electrically coupled to the test device.

The apparatus disclosed by Faraci in U.S. Pat. No. 4,540,227 is exemplary of this arrangement.

This basic concept for coupling the electronic apparatus to the test device is advantageous in that it permits rapid testing and easy coupling of the electronic apparatus to the test device. However, the equipment and components heretofore used in carrying out this concept are subject to a variety of problems, and these problems can best be considered with reference to each of the subassemblies making up this equipment.

One prior art panel assembly includes a plurality of connector bars, each having a large number of conductive contacts thereon, a large pressure plate having a plurality of the connector bars mounted thereon and springs for urging each of the connector bars away from the pressure plate. The contacts carried by the connector bar are brought into engagement in the panel receiver with the array of contacts carried by the panel receiver. The springs allow the connector bars to move somewhat relative to the large pressure plate to take up tolerances and to assure that all of the contacts carried by the connector bars are brought into engagement with the array of contacts carried by the panel receiver.

Unfortunately, with this construction, proper electrical engagement between contacts is not assured, and the connector bars are not able to move relative to each other to accommodate tolerances and other variations as much as desired. The connector bars are not easily connected and disconnected to and from external circuitry, and if a connector bar is removed from the pressure plate, the springs for that connector bar fall out of the panel assembly. Also, the circuits on the connector bars mate to circuits on a rigid plate.

In the prior art panel receiver, the table is raised by rotatable cams which slide along the underside of the table. This undesirably increases the force required to actuate the cams and increases wear on these engaging surfaces. In addition, the panel receiver cannot raise the panel assembly with the precision desired, and the pin contact termination is outside the panel receiver.

SUMMARY OF THE INVENTION

This invention provides a quick-release, interfacing assembly which overcomes these problems and which provides other advantageous features. This invention provides a module assembly and cartridge assemlby which overcome the problems noted above with the prior artcartridge assembly. IN addition this invention provides a panel receiver which eliminates the objectionable wear between the cams and the table and also provides for accurately guiding and moving of the cartridge assembly which is inserted into the panel receiver.

This invention provides a pluraltiy of module assemblies which can be inserted into a carrier to form a cartridge assembly. Each of the module assemblies includes a connector body having numerous conductive contacts and conductive leads thereon. To facilitate connecting and disconnecting of the module assembly, the connector body has plurality of contact pins mounted thereon and projecting therefrom.

To enhance relative movement between connector bodies of different module assemblies, each module assembly preferably includes a pressure member coupled to the connector body and biasing means for resiliently resisting relative movement of the connector body and the pressure member toward each other. Unlike the pressure plate of the prior art, each pressure member is coupled to only a single one of the connector bodies so that relative movement between the pressure member and the connector body is facilitated.

To provide essentially free access to the contact pins, the contact pins are not covered by the pressure member. In a preferred construction, the contact pins are mounted on first and second flanges of the connector body, and the pressure member extends along a mounting section between the contact pins on the two flanges.

Another important way that this invention assures proper electrical engagement among contacts is by employing contact dots and contact pads on the module assembly. The contact pads have larger contact areas, i.e., exposed areas adapted to engage the contacts of another contact-carrying device, than the contact areas of the contact dots. With this construction, the contact dots and contact pads are adapted to engage contact pads and contact dots, respectively, of another contact-carrying device.

This arrangement of contact dots and contact pads can be provided at minimum cost, and both mating circuits can be identical. It also accommodates contact misalignment while allowing a maximum number of circuits to be carried by the module assembly and while allowing good electrical contact. The contact pads and contact dots can be used to provide redundancy, and they can advantageously be constructed in accordance with Reardon et al U.S. Pat. No. 4,125,310 and Moulin U.S. Pat. No. 4,453,795 so as to increase the likelihood of obtaining proper electrical engagement with the contacts to be engaged.

In a preferred construction, the cartridge assembly of this invention includes a carrier having a plurality of pockets therein with each of the pockets having a first opening and a plurality of the module assemblies in the pockets, respectively, with the contact being exposed through the openings. The connector bodies and the pressure members engage the carrier with the biasing means being partially compressed so that the connector bodies and the associated conductive leads can resiliently float relative to each other and the carrier. A cartridge assembly may have contacts exposed at one side and, therefore, be a single cartridge assembly or have contacts exposed at opposite sides and, therefore, be a dual or multiple cartridge assembly.

The table of the panel receiver can advantageously be moved by cam means engageable with the table. The cam means is substantially prevented from undergoing relative sliding movement between the table and the cam means at the interface between the table and the cam means. Although such means can take different forms, in a preferred construction, the cam means includes first and second cam shafts, means for coupling the shafts for pivotal movement of the second shaft about the first shaft and at least one roller carried by each of the cam shafts. With this construction, the second shaft is raised by pivoting it about the first shaft and is firmly and evenly supported along its length. Some of the rollers on the second shaft self-align and rotatably engage the table to thereby preclude relative sliding movement as a result of actuation of the cam means.

Another important feature of the panel receiver is that it may include first and second elevators at the opposite ends of the cartridge receiving space. The elevators perform several important functions, including guiding of the cartridge assembly to the correct position upon insertion of the cartridge assembly into the panel receiver. They may also impart at least some of the movement of the cartridge assembly toward its final or extended position in which the contacts thereof are in firmly seated engagement with the array of contacts of the panel receiver. Guide rods accurately position the cartridge assembly in the X-Y plane before and during movement of the cartridge assembly along the "Z" axis.

In the desired sequence of operation, the table is moved toward a stress or compression member to move the cartridge assembly off the elevators and toward the stress member. Thereafter, the elevators are moved toward the stress member to urge the cartridge assembly toward the stress member and to bring the contacts of the cartridge assembly and the array of resilient contacts into tight engagement. The movement of the elevators can advantageously be carried out by movement of the table.

The invention, together with additional features and advantages thereof, may best be understood by reference to the following description taken in connection with the accompanying illustrative drawing.

BRIEF DESCRIPTION OF THE DRAWING

In the accompanying drawings:
FIG. 1 is a perspective view of a module assembly constructed in accordance with the teachings of this invention;
FIG. 1a is an enlarged plan view illustrating a preferred construction for the interfacing contacts of the module assembly.
FIG. 2 is a sectionl view taken generally along line 2—2 of FIG. 1;
FIG. 3 is a sectional view taken generally along line 3—3 of FIG. 2;
FIG. 3a is an enlarged fragmentary sectional view illustrating the attachment of one of the contact pins to the flexible sheet.

FIG. 5 is a perspective view illustrating a dual cartridge assembly and one preferred form of panel assembly with the table in the extended position and with parts broken away;
FIG. 5a is a perspective view similar to FIG. 5 with parts broken away and removed from the panel receiver.
FIG. 5b is a sectional view taken generally along line 5b-5b of FIG. 5a.
FIGS. 9-11 are fragmentary, sectional views similar to FIG. 8 illustrating the sequence of operation of the panel receiver.

DESCRIPTION OF THE PREFERRED EMBODIMENT

Figure 4:
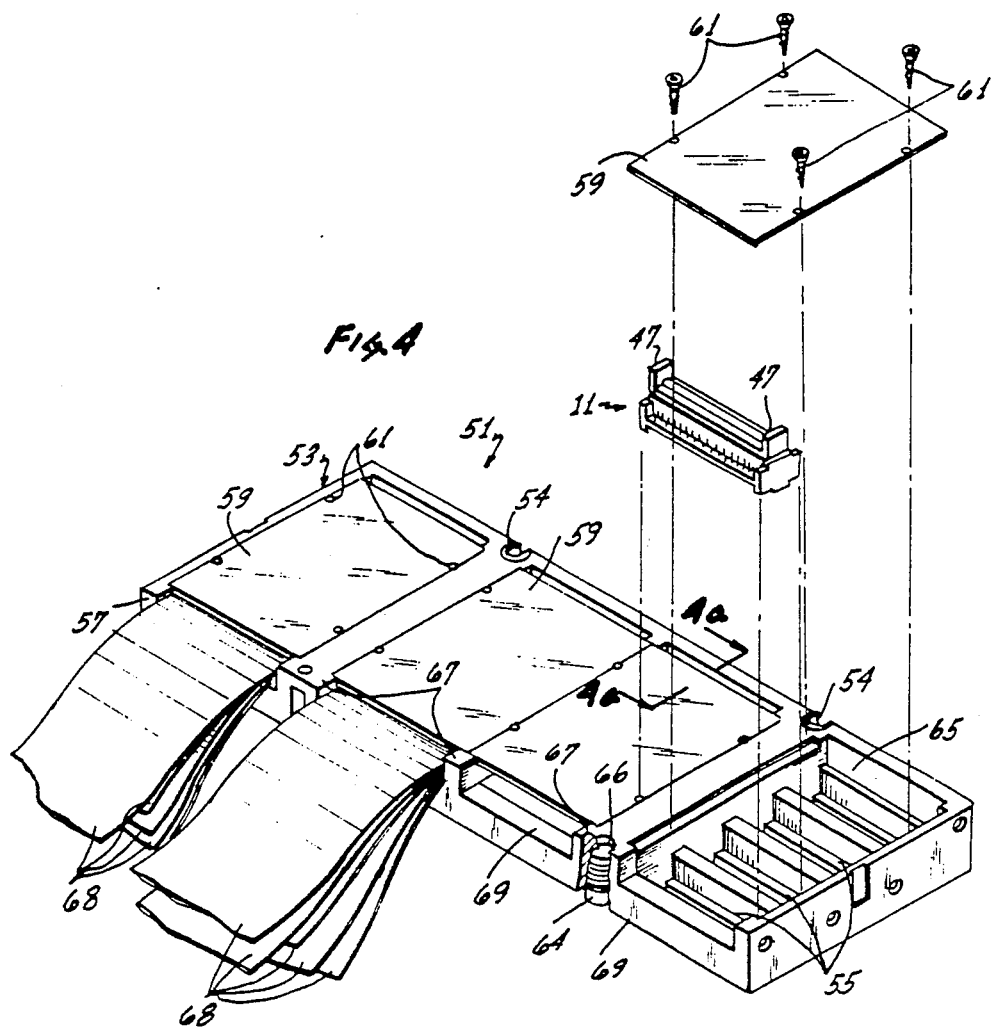
FIG. 4 is an exploded, isometric view of a single plug cartridge assembly.

FIGS. 1-3 show a module assembly 11 which generally comprises on insulating connector body 13, contact pins 15 mounted on the connector body and projecting therefrom, sheet 17, which is preferably flexible, having a plurality of conductive contacts or contact dots and contact pads 21 and 23 and conductive leads 25 thereon, a pressure member 27 and biasing means in the form of a plurality of springs 29 for resiliently resisting relative movement of the connector body and the pressure member toward each other. The connector body 13 in this embodiment is elongated and has end plates 30 with a polarizing key 32 on one of the plates 30, first and second longitudinally extending flanges 31 with first and second groups of the contact pins 15 mounted thereon, respectively, and a mounting section 33 between the flanges and the two groups of contact pins and between the end plates 30. As shown in FIGS. 2 and 3, the mounting section 33 has an elongated socket 35 for recieving a portion of the pressure member 27, and in-turned flanges 37 at the opposite ends of the socket for cooperating with flanges 39 on the pressure member 27 to thereby couple the pressure member to the connector body for limited relative movement of the connector body and the pressure member toward and away from each other. The mounting section 33 also has cavities 41 for receiving the springs 29, respectively.

The flexible sheet 17 is constructed of a suitable dielectric material, and the contacts 21 and 23 are preferably in the form of gold contact dots and gold contact pads, respectively. The leads 25 are coupled to the contacts 21 and 23. A flexible sheet of this type is shown and described in Reardon et al U.S. Pat. No. 4,125,310. The contacts 21 and 23 are adapted to engage similar contacts 23 and 21, respectively, as described more fully hereinbelow. The contacts 21 and 23 and portions of the leads 25 along the top (as viewed in FIGS. 1-3) of the mounting section 33 are exposed, and the remainder of the leads 25 is preferably covered with a dielectric layer which forms a portion of the flexible sheet 17.

More specifically, FIG. 1a shows a preferred arrangement for the contacts 21 and 23. As shown in FIG. 1a, each of the contacts 21 and 23 has an upwardly facing contact area of generally circular configuration which is adapted to engage contacts, respectively, of another contact-carrying device (not shown) in FIG. 1a. The contact areas of the contact pads 23 are substantially larger than the contact areas of the contact dots 21. The contact dots 21 are coupled to the contact pads by a conductive strip and are raised slightly with respect to the conductive strip. The contact dots and pads each comprise conductive material having resilient memory as described in Reardon U.S. Pat. No. 4,125,310, which is incorporated by reference herein. A major difference, however, between the arrangement of FIG. 1a and the disclosure of Reardon et al is that the module assembly 11 carries both the contact dots 21 and the contact pads 23, whereas in the Reardon et al construction, one contact-carrying device carries the contact dots and a second contact-carrying device, which is adapted for engagement with the first contact-carrying device, carries the contact pads.

As shown in FIGS. 1 and 1a, first and second groups of the conductors are each arranged in side-by-side relationship, and associated groups of the contact dots 21 and the contact pads 23 are arranged along the leads 25 to form, in effect, a dual connector. With this construction, the contact dots 21 of the lower group as shown in FIG. 1 are in side-by-side relationship as are the contact pads 23 of the lower group. The same is true of the contact dots 21 and the contact pads 23 of the upper group shown in FIG. 1a. More specifically, each group of the contact dots 21 and the contact pads 23 are linearly arranged, and each of the leads 25 is directly coupled to one of the contact dots 21 and one of the contact pads 23. Also, the positions of the contact dots 21 and the contact pads 23 in the upper and lower groups shown in FIG. 1 are reversed so that, in moving transversely across the module assembly, the contact pads alternate with the contact dots.

Although various arrangements are possible, the contact dots 21 and the contact pads 23 are adapted to engage the contact pads 23 and contact dots 21, respectively, of another contact-carrying device. This is illustrated schematically in FIG. 1a by the contact dots 21' and the contact pads 23', which are shown in dashed lines. There are several advantages to this arrangement. First, the contact dots 21 and the contact pads 23 may be used to provide redundancy so as to better assure that all of the circuits will be completed. Also, by providing the contact dots 21 and the contact pads 23 on the same module assembly 11, a bigger tolerance zone for engaging the other contact-carrying device is provided than if the module assembly 11 carried only the contact dots 21 or the contact pads 23. Also, with the arrangement shown, some misalignment of the contacts of the other contact-carrying device can be tolerated because partial contact will be achieved with both the contact dots 21 and the contact pads 23.

The module assembly 11 also includes a soft strip or resilient pad 32 sandwiched between a central region of the flexible sheet and the mounting section 33. More specifically, the strip 43, which may be constructed of an elastomer, lies beneath the contacts 21 and 23 to provide a cushion to accommodate surface irregularities in the mating surface against which the contacts are to be pressed. Opposite end portions 44 of the strip 43 extend outwardly of the sheet and at least one of the end portions is bonded to the mounting section 33 with none of the bonding material getting beneath the sheet where it could interfere with flexure of the sheet.

The flexible sheet 17 is formed over the top (as viewed in FIGS. 1–3) of the mounting section 33 and along the top of the flanges 31, with the pins 15 being electrically coupled to the leads 25, respectively. The pins 15 project through the flanges 31 and 33 and through the portions of the flexible sheet 17 that overlie the flanges 31. As best seen in FIG. 3a, the flexible sheet 17 has apertures 42 which are greatly oversized with respect to the diameter of the contact pins 15 to facilitate placement of the sheet 17 over the protruding portions of the contact pins. A suitable conductive bonding material, such as solder 44, envelops most or all of the protruding portion of the contact pins 15, overlies a portion of the flexible sheet 17 and flows through the apertures 42 to the region between the flexible sheet 17 and the flange 31 as shown in FIG. 3a. Thus, the solder 44 attaches the contact pins to the flanges 31, electrically couples the contact pins 15 to the leads 25, holds the flexible sheet 17 slightly spaced from the flange 31 and provides a seal around the contact pins. A layer of sealing material 46 covers the solder 44 an extends for substantially the full length of the flanges 31. Any suitable sealing material, such as a modified acrylic, may be used. Although various techniques may be used to couple the sheet 17 to the connector body 13, in the embodiment illustrated, this attachment function is provided primarily by the solder 44.

As best seen in FIG. 3, the flexible sheet 17 overlies on side, i.e., the upper side, of the connector body 13, and the contact pins 15 project a significant distance from the other side of the connector body. Similarly, the pressure member 27 extends along the mounting section 33 on the same side of the connector body 13 as the side from which the contact pins 15 project. The pressure member 27 is elongated, generally co-extensive with the mounting section 33 and is narrower than the transverse dimension of the lower (as viewed in FIG. 3) side of the connector body 13, so that the contact pins 15 are uncovered by the pressure member 27. More specifically, the pressure member 27 includes a web 45 extending along the connector body 13 and two flanges 47 integrally joined by the web and extending away from the connector body in a direction such that squeezing of the module assembly 11 between the flanges 47 and the connector body 13 moves the connector body and pressure member toward each other against resilient biasing action of the springs 29.

The interlocking flanges 37 and 39 couple the pressure member 27 to the connector body 13 for limited relative movement toward and away from each other and for limited relative pivotal movement about three orthogonal axes. Prefreably, the springs 29 are allowed to be in the relaxed state by the interlocking flanges 37 and 39.

With this construction, the contact pins 15 provide for easy connection and disconnection of the module assembly to external circuits. The pressure member 27, which is coupled to only a single one of the connector bodies 13, does not interfere with the coupling of socket connectors or cable or wire harnesses (not shown) to the contact pins on the flanges 31. In addition, the connector body 13 can undergo a wide range of movements relative to the pressure member 27. The pressure member 27 and the connector body 13 are permanently interconnected by the interlocking flanges 37 and 39, and disassembly of these two components is not contemplated.

Figure 4A:
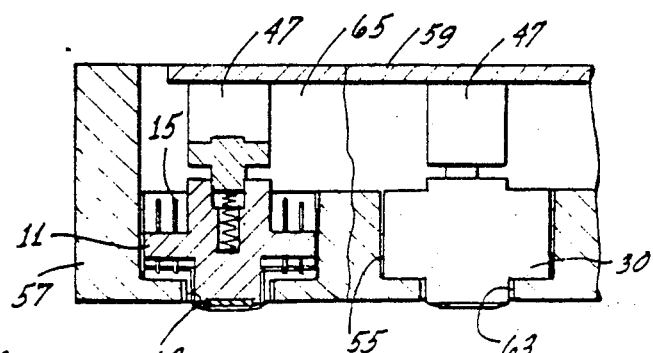
FIG. 4a is an enlarged, fragmentary sectional view taken generally along line 4a—4a of FIG. 4.

FIGS. 4 and 4a show a cartridge assembly 51 in the form of a single cartridge assembly which comprises a plurality of the module assemblies 11 and a carrier 53. The module assembly 11 is preferably constructed in accordance with FIGS. 1-3; however, the module assemblies employed in the cartridge assembly 51 may be of various different constructions and need not have the particular construction or features of the module assemblies 11 of FIGS. 1-3.

In the embodiment illustrated, the carrier 53 has radially opening bearings 54 and a plurality of pockets 55. One of the pockets receives each of the module assemblies 11. Preferably, the carrier 53 includes a carrier body 57 having the pockets 55 therein and cover means in the form of one or more cover sections 59 removably attached to the carrier body in any suitable manner, such as by screws 61. As shown in FIG. 4a, each of the pockets 55 opens downwardly in an opening 63 and opens upwardly into a common opening 65 which is common for a group of the pockets 55. One of the cover sections 59 covers and closes each of the common openings 65. Adjacent common openings 65 are separated by a wall 67 of the carrier body 57. Two plungers 64 are carried by the carrier 53 and extend outwardly of the carrier on the same side as the opening 63. The plungers are biased outwardly of the carrier by suitable resilient means, such as springs 66.

As shown in FIG. 4a, the module assemblies 11 are loosely received, respectively, in the pockets 55 so that the conductive leads 25 are neither shorted nor damaged and to allow the connector body 13 to float relative to the pressure member 27. Accordingly, the module assemblies 11 float independently in the carrier 53. The contact dots 21 and contact pads 23 are exposed and protrude through the openings 63. In this embodiment, a region of the module assembly 11 projects through the associated opening 63 such that the contacts 21 and 23 carried thereby are slightly outside of the carrier body 57.

The distal ends of the contact pins 15 are spaced from the carrier 53 such that socket connectors (not shown) can be attached to the contact pins, and cables 68 for the socket connectors can extend between, and be guided by the flanges 47, and then outwardly through side openings 69 which form a portion of the common openings 65, respectively. In FIG. 4, only five of the cables 68 are shown for each of the side openings 69. As shown in FIG. 4, the side openings 69 are not covered by the cover sections 59.

The module assemblies 11 are retained in the pockets 55, respectively, by virtue of the engagement of the connector bodies and pressure members 27 with the carrier 53. More specifically, the end plates 30 of the connector bodies 13 and the flanges 47 of the pressure members 27 engage the carrier body 57 and the cover sections 59, respectively, so that the springs 29 are partially compressed. In this regard, the openings 63 are sufficiently oversized in relation to the mounting section 33 so as to permit a rocking motion about three mutually perpendicular axes, as well as linear inward motion of the connector body 13. The spaced apart flanges 47 enable the pressure members 27 to positively engage the associated cover section 59 while allowing space for the passage of cables 68. In addition, the flanges 47 serve as guides for the cables 68.

Although it would be possible to use the single cartridge assembly 51, it is preferred to use a double or dual cartridge assembly 71 (FIG. 5). Of course, more than two cartridge assemblies may be used, if desired. The double cartridge assembly 71 includes the cartridge assembly 51, an identical cartridge assembly 51a and coupling means for attaching the cartridge assemblies together as shown in FIG. 5 with the contacts 21 and 23 of both of the cartridge assemblies facing outwardly in opposite directions and with the bearings 54 and 54a aligned. Portions of the cartridge assembly 51a corresponding to portions of the cartridge assembly 51 are designated by corresponding reference numerals followed by the letter "a."

More specifically, the coupling means can advantageously take the form of first and second plates 73 and 75 attached to the opposite ends of the carriers 53 and 53a, respectively, of the cartridge assemblies 51 and 51a. The plates 73 and 75 can be attached to the carriers 53 and 53a in any suitable manner, such as by threaded fasteners 77. The plates 73 and 75 also serve ot hold the cartridge assemblies 51 and 51a in the proper orientation relative to each other, and they provide terminals 79 for coupling to the electronic input and output devices which are in turn coupled to the electronic apparatus (not shown) to be tested. Preferably, the plates 73 and 75 extend above, below, forwardly and rearwardly beyond the cartridge assemblies 51 and 51a. With the cartridge assemblies 51 and 51a interconnected in this fashion, each of the side openings 69 has a corresponding confronting side opening 69a of the cartridge assembly 51a as shown in FIG. 5.

Figure 6:
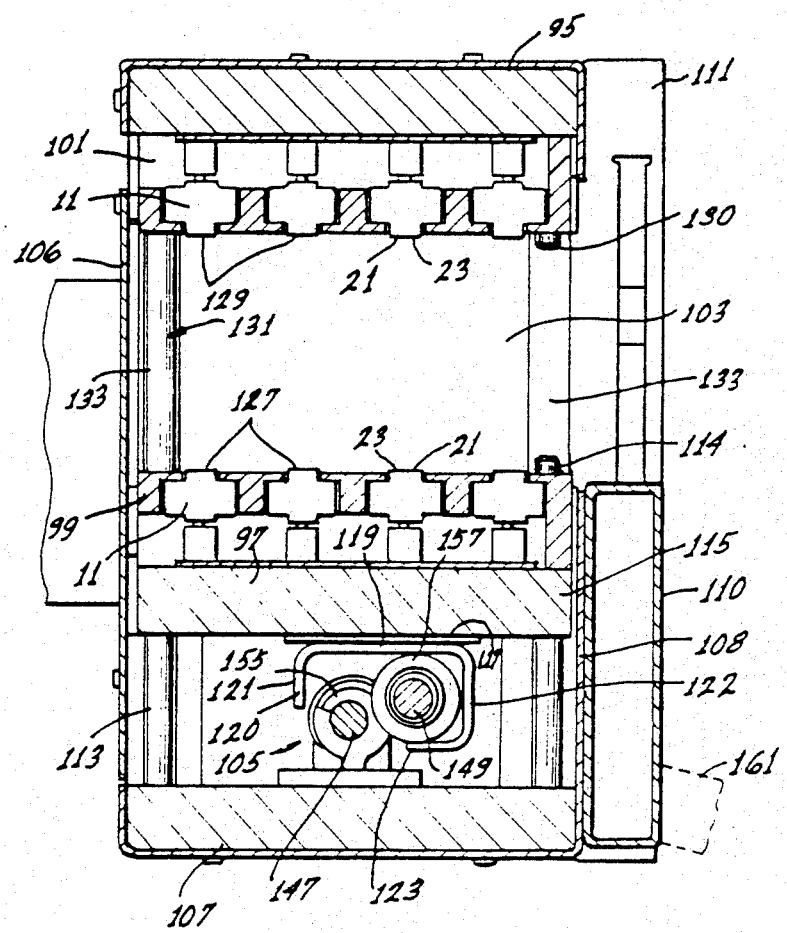
FIG. 6 is a sectional view on a transverse plane through the panel receiver with the table in the retracted position and with no dual cartridge assembly in the panel receiver.

FIGS. 5-11 show a panel receiver 91 which is adapted to be coupled to test equipment, such as a computer (not shown), and to receive the double cartridge assembly 71 (FIG. 5). Generally, the panel receiver 91 includes supporting structure 93, a compression or stress member 95 (FIGS. 6-8) which forms a roof for the panel receiver and a table 97 mounted on the supporting structure for movement toward and away from the stress member between an extended position (FIGS. 7 and 8) and a retracted position (FIG. 6). The panel receiver 91 also includes a removable lower single receptacle cartridge assembly 99 (FIGS. 5 and 6-8) resting on the table 97 and an upper single receptacle cartridge assembly 101. Accordingly, as shown in FIG. 6, there is a cartridge-receiving space 103 between the stress member 95 and the table 97, and more specifically, between the cartridge assemblies 99 and 101. The cartridge-receiving space 103 is adapted to receive the double cartridge assembly 71 (FIG. 5). The panel receiver 91 also includes cam means 105 engageable with the table 97 for moving the table from the retracted position of FIG. 6 to the extended position of FIG. 7.

Figure 7:
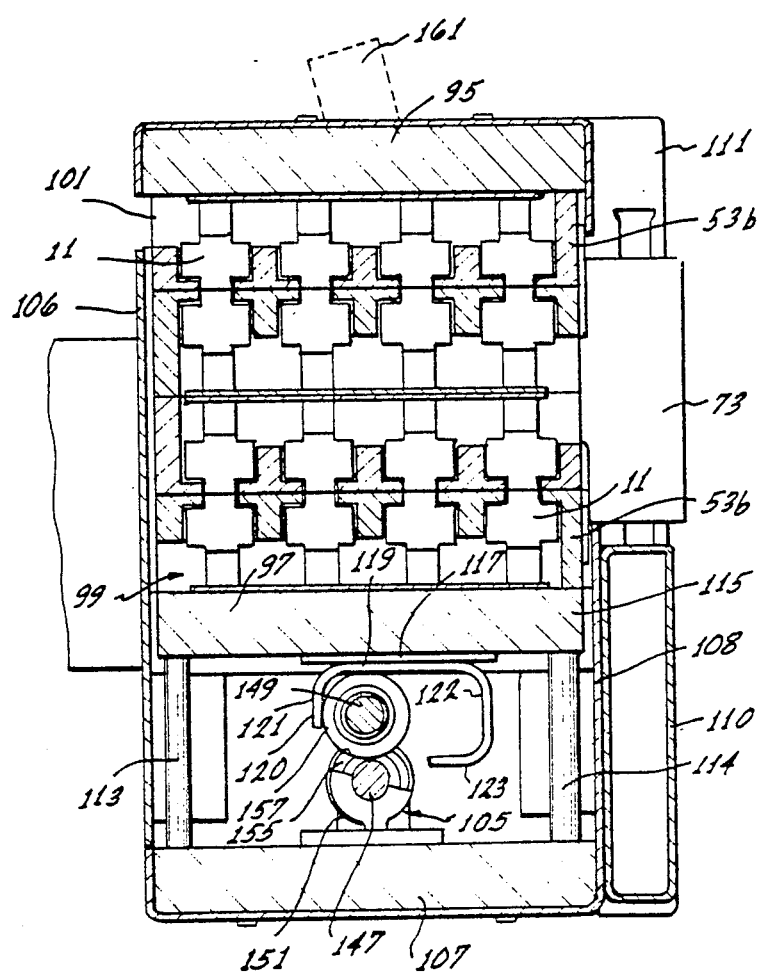
FIG. 7 is a sectional view similar to FIG. 6 with the table in the extended position and with a double cartridge assembly in the panel receiver.

More specifically, the supporting structure 93, which can be of various different constructions, includes a base plate 107, opposite side plates 109 and 111 firmly attached to the base plate and the stress member 95. Thus, the stress member 95 also forms a portion of the supporting structure 93. The upper cartridge assembly 99 is suitably mounted on the side plates 109 and 111. The rear of the structure may be closed with a suitable cover plate 106 (FIGS. 6 and 7). The front is closed by a protective front cover 108 and a door 110 suitably mounted for vertical movement by side plates 109 and 111 between an open or lower position (FIG. 5) and an upper or closed position in which it closes the cartridge receiving space 103 to prevent electrical shocks that could result from touching the contact arrays 127 or 129. The door 110 can be held in the upper or closed position by one or more latches 112. The supporting structure 93 also includes parallel guide rods 113 (FIGS. 5a-8) extending between, and attached to, the base plate 107 and the stress member 95 and parallel guide rods 114 attached to the table 97 and extending upwardly above the table 97 and downwardly to the base plate 107 where their lower ends are received in linear bearings 116 mounted on the base plate. The supporting structure 93 is preferably constructed of strong, rigid metal, such as steel or high-yield aluminum, so as to provide minimum deflection during use.

The table 97 is mounted for vertical, reciprocating movement on the guide rods 113 and 114. The table 97 includes a table plate 115, a cam actuation plate 117 and a cam actuation bracket 119. The plate 117 and the bracket 119 are suitably attached to the underside of the table plate 115. The bracket 119 is comprised of a generally U-shaped section 121 having opposite legs 120 and 122 and a flange 123 extending inwardly from the leg 122.

Except for replacing plungers 64 with linear bearings which receive the rods 114 and 130 and reversing the orientation so that the common openings 69 face the rear of the panel receiver 91, the cartridge assemblies 99 and 101 may be substantially identical to the cartridge assembly 51. Thus, each of the cartridge assemblies 99 and 101 includes a carrier 53b and module assemblies 11 which present a lower array 127 (FIG. 5) of contacts 21 and 23 and an upper array 129 (FIG. 6) of contacts 21 and 23. The arrays 127 and 129 of contacts 21 and 23 project into the cartridge assembly receiving space 103 and are suitably coupled through the openings 69 to a computer (not shown) or other test device for testing the device to be tested. The contacts 21 and 23 of the lower array 127 are reversed with respect to the contacts 21 and 23 of the upper array 129 so that they would mate as shown in FIG. 1a. The module assemblies 11 are resiliently movable with respect to their carriers 53b in the same manner as described above with respect to the module assemblies 11 and can be pushed or rocked inwardly of the carrier 53 as may be required upon engagement with an external member or other contacts. The cartridge assembly 99 slidably receives the guide rods 113 and is positioned around the guide rods 114. The upper cartridge assembly 101 receives two guide rods 130 (only one being shown in FIG. 6) which are mounted on the stress member 95 and which are generally axially aligned with the guide rods 114, respectively. Of course, if only a single cartridge assembly 51 were to be received in the space 103, only one of the arrays 127 and 129 would be required.

The panel receiver 91 also includes substantially identical elevators 131 (FIGS. 5, 5a, 6 and 8) mounted on the supporting structure 93 at the opposite ends of the cartridge receiving space 103 for movement in the same direction as the table 97. In the embodiment illustrated, such direction is generally vertical. Because the elevators 131 are substantially identical, the portions thereof are designated by corresponding reference numerals.

Each of the elevators 131 includes a pair of vertically extending parallel lets 133, a central cross member or guide 135 and an upper cross member 137. The guide 137 and the cross member 137 are rigidly attached to the legs 133. A lower segment 138 of each of the legs 133 is thickened to provide a shoulder 141 at the upper end of each of such segments 139 and a gap 143 between each of the shoulders 141 and the associated guide 135. The lower segments 139 can be formed in any desired way, such as by affixing a small plate to the associated leg 133 so as to thicken such segment of the leg.

Although the elevators 131 can be mounted for movement in various different ways, in the illustrated embodiment, each of the side plates 109 has vertically extending groovs 145 for slidably receiving the legs 133 as best shown in FIGS. 5-5b. The legs 133 can be retained within their associated grooves 145 in any suitable manner, such as by the table 97 or by configuring the legs and grooves in a dovetail fashion.

Figure 8:
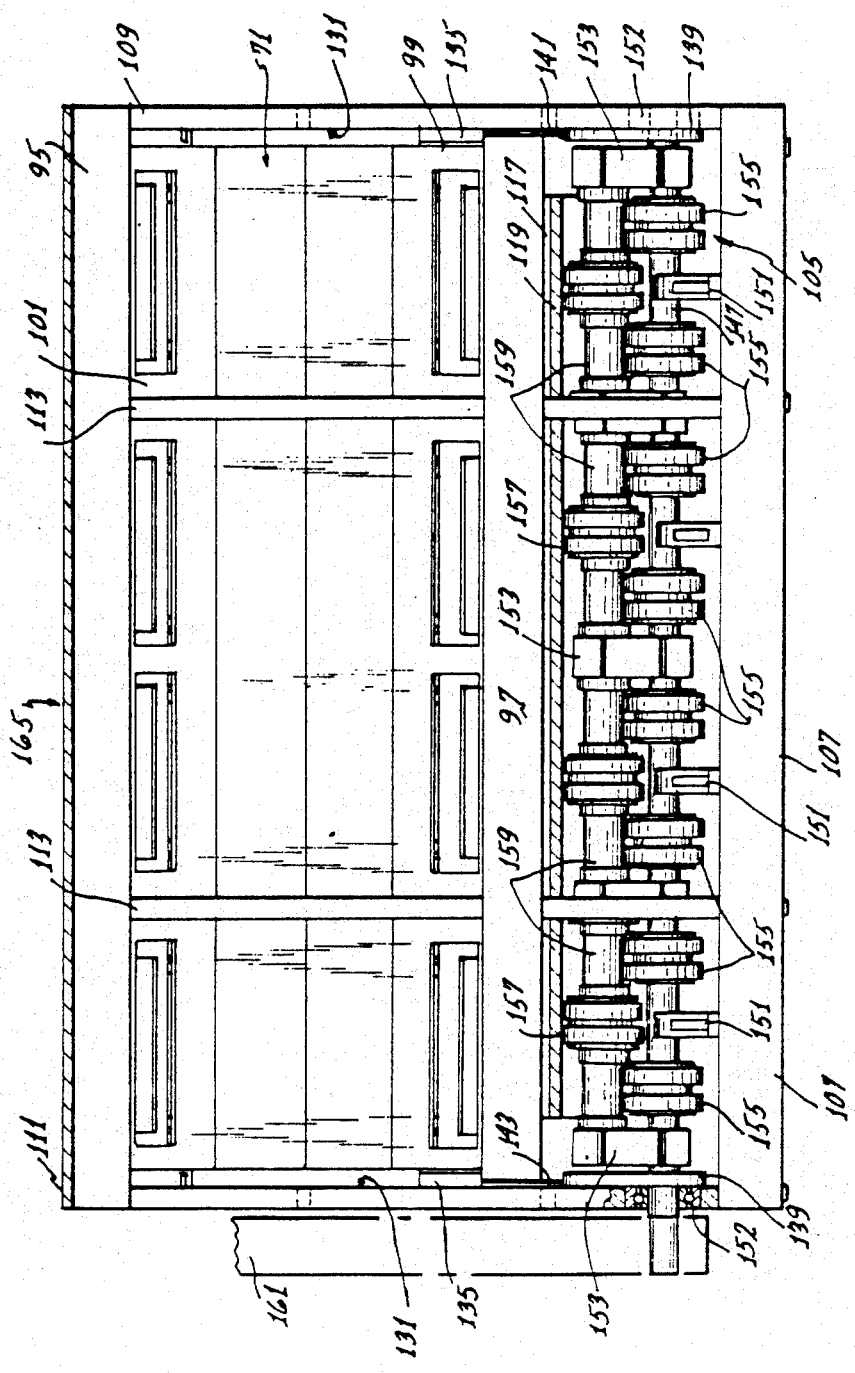
FIG. 8 is a rear elevational view of the panel receiver with the rear cover removed and with the table in the extended position.

The cam means 105 is used to move the table from the retracted position of FIG. 6 to the extended position of FIG. 7. The cam means 105 includes cam shafts 147 and 149 (FIGS. 5a-8), shaft supports 151 and additional shaft supports in the form of bearings 152 (FIG. 8) in side plates 109 and 111 for rotatably mounting the cam shaft 147 on the base plate 107 and the side plates, shaft connectors 153 for coupling the cam shafts for pivotal movement of the cam shaft 149 about the cam shaft 147, rollers 155 rotatably mounted in spaced relationship on the cam shaft 147, table support rollers 157 rotatably mounted on the cam shaft 149, and rollers in the form of bushings 159 rotatably mounted on the cam shaft 149 intermediate the rollers 157. As best shown in FIGS. 5a and 8, the rollers 155 are spaced axially along the cam shaft 147, and they are mounted for rotation independently of the cam shaft 147. The bushings 159 are similarly mounted on the cam shaft 149 for rotation independently of the cam shaft 149, and they rotatably engage and are supported by associated rollers 155. The table support rollers 157 are mounted on the cam shaft 149 for independent rotation relative thereto, and they rotatably engage the bracket 119 of the table 97. The rollers 157 support the table 97 at longitudinally spaced locations along the cam shaft 149. Because the rollers 157 can roll with respect to the bracket 119 of the table 97, there is essentially no relative sliding movement or wearing or grinding between the table 97 and the cam means 105 at the interface between the cam means and the table, i.e., where the rollers 157 contact the bracket 119, when the cam means 105 moves the table from the retracted position of FIG. 6 to the extended position of FIGS. 7 and 8.

To operate the cam means 105, it is only necessary to rotate the cam shaft 147. The shaft connectors 153 rotate with the cam shaft 147 to move the cam shaft 149, the rollers 157 and the bushings 159 around the cam shaft 147. The rollers 155 and the shaft connectors 153 support the cam shaft 149 during this movement, and the rollers 155 and bushings 159 help assure that this movement will be carried out with a minimum of frictional losses. The rollers 157 rotate on the cam shaft 149 and against the bracket 119 to provide low friction and to minimize wear. The rollers 157 support the table 97 at longitudinally spaced positions so that deflection of the table is minimized.

In use of the panel receiver 91, very substantial forces are applied to the table 97 and to the cam means 105, and it is important that deflection of the table and cam means be held to a minimum. The cam means 105 of this invention materially contributes to this desirable result by virtue of supporting the cam shaft 147 at multiple locations with the shaft supports 151 and 152, by use of a multiplicity of the rollers 155 and 157 and of the bushings 159 and by using multiple shaft connectors 153 so as to maintain the axes of the cam shafts 147 and 149 parallel during operation of the cam means. Of course, the number and positioning of the shaft support 151, the shaft connectors 153, the rollers 155 and 157 and the bushings 159 can be varied by those skilled in the art depending upon the results desired.

As best shown in FIGS. 6 and 7, the center of the cam shaft 149 moves over center of the cam shaft 147, e.g. about 5 degrees, in the extended position and is prevented from further counterclockwise rotation about the cam shaft 147 as viewed in FIG. 7 by the leg 120 of the U-shaped section 121. Clockwise movement of the cam shaft 149 about the cam shaft 147 when the table 97 is in the extended position is inhibited by the positioning of the center of the cam shaft 149 to the left (as viewed in FIG. 7) of the center of the cam shaft 147. Similarly, in the retracted position of FIG. 6, additional clockwise movement of the cam shaft 149 about the cam shaft 147 is prevented by the flange 123 and by the table 97 resting on the shoulders 141 (FIG. 9) and by the elevators 131 resting on the base plate 107. Thus, the cam means 105 tends to retain itself in either the extended or retracted position of the table 97. The table 97 and the cam means 105 can be arranged to move to the extended position by rotation of the handle 161 counterclockwise, if desired.

Although the cam shaft 147 can be rotated in different ways, rotational movement can be imparted to the cam shaft quickly, efficiently and inexpensively by using a manual crank or handle 161 coupled to the cam shaft 147 in any suitable manner, such as by a key and key way. To assist in retaining the table 97 in the extended position, the cranks 161 may be releasably retained with the table 97 in the extended position in any suitable manner, such as by a magnet and/or a suitable releasable mechanical locking device 163 (FIG. 5) carried by the side plate 111.

In use of the panel receiver 91, the double cartridge assembly 71 (FIG. 5) is inserted into the space 103 (FIG. 6) using the side plates 109 and 111 and the top of the door 110 for initial guidance, with the plates 73 and 75 being supported on the upper edges of the guides 135 and with the plates spaced from the cross member 137 as shown in FIG. 9. The panel receiver 91 and the double cartridge assembly 71 form a quick-release interfacing assembly 165 (FIG. 8). The guides 135 guide the double cartridge assembly 71 into the desired position within the panel receiver 91 and support the cartridge assembly in the desired position. The double cartridge assembly 71 is slid into the space 103 until the bearings 54 and 54a (FIGS. 4 and 5) engage and partially encircle the guide rods 113 to establish the desired X-Y position for the cartridge assembly. The guides 135 support the cartridge assembly 71 in this position and establish the desired location of the cartridge assembly along the "Z" axis. With the double cartridge assembly in this position, the module assemblies 11 carried thereby are in slightly spaced, confronting relationship with the contact arrays 127 and 129, respectively, below and above the double cartridge assembly. In this position, the table 97 rests on the shoulder 141, and the table is spaced below the lower edges of the guides 135.

Next, the crank 161 (FIGS. 5 and 5a) is rotated to move the cam means from the retracted position of FIG. 9 through the intermediate positions of FIGS. 10 and 11 to an extended position of FIG. 8. In FIG. 10, the rollers 155 have lifted the table 97 to bring the contact array 127 of the lower cartridge assembly 99 into engagement with the downwardly facing contacts of the module assemblies 11 carried by the double cartridge assembly 71 and to lift the double cartridge assembly 71 upwardly along the guide rods 113 and slightly off the guides 135. Thus, in the position of FIG. 10, the double cartridge assembly 71 is supported by the contact array 127 of the lower cartridge assembly 99, the X-Y orientation of the cartridge assembly is accurately controlled by the guide rods 113, 114, and 130, the double cartridge assembly 71 is moved somewhat toward the upper cartridge assembly 101 and the plates 73 of the double cartridge assembly are raised into engagement of nearly into engagement with the cross member 137 which prevents tilting of the double cartridge assembly. The elevators 131 remain stationary as the table 97 is moved from the position of FIG. 9 to the position of FIG. 10. The bearings 54 and 54a cooperate with the guide rods 113 to guide the vertical movement of the double cartridge assembly.

Continued rotation of the crank 161 toward the position shown in FIG. 5 ultimately brings opposite edges of the table 97 into engagement with the lower edges of the guides 135, respectively, (FIG. 11), and this may happen after the upwardly facing contacts of the cartridge assembly 71 engage the contact array 129. In any event, continued upward movement of the table 97 causes elevation of the elevators 131 by virtue of the engagement between the table and the guides 135. Ultimately, the upper edges of the guides 135 engage the lower edges of the plates 73 and 75 so that further movement of the table 97 toward the extended position results in movement of the elevators 131, including the guides 135, the double cartridge assembly 71 and the lower cartridge assembly 99 toward the extended position of FIG. 8. It is not essential, however, that the elevators 131 lift the cartridge assembly 71 as the lifting function could be carried out by the lower cartridge assembly 99, if desired.

In the extended position, the opposite edges of the table 97 engage the associated guides 135 to tightly hold the upwardly facing contacts of the double cartridge assembly 71 against the upper contact array 129. The lower contact array 127 is tightly held against the downwardly facing contacts of the double cartridge assembly by the table 97. This arrangement assures that both the upwardly and downwardly facing contacts of the double cartridge assembly 71 will be tightly pressed against the associated contact arrays 127 and 129. Thus, the panel receiver 91 can be quickly operated to test the device to be tested. By reversing the rotation of the crank 161, the table 97 is moved back to the retracted position by gravity and by controlled engagement of the rollers 157 against the flange 123 (FIG. 6). Accordingly, the double cartridge assembly 71 can be quickly and easily replaced in the panel receiver 91 with another double cartridge assembly coupled to another device to be tested. In moving to the extended position, the plungers 64 are forced inwardly against the associated springs 66 by engagement with the cartridge assemblies 99 and 101. When the crank 161 is turned to move the table 97 to the retracted position, the plungers 64 are pushed outwardly by the associated springs 66 against the cartridge assembly 99 and 101 to positively separate the contacts 21 and 23 of the double cartridge assembly 71 from the contact areas 127 and 129. This separating force is sufficient to overcome any tendency that the contacts 21 and 23 may have to stick to the contact arrays 127 and 129.

Because there are a large number of the module assemblies 11, which form a part of the double cartridge assembly 71, a substantial force is required to assure that good electrical contact is achieved between all of the contact pairs that are to be engaged. This requires that the table 97 and the cam means 105 be subject to only minimal deflection, and the present invention achieves that deirable result.

It should be understood that the panel receiver 91 can be used in association with single or multiple cartridge assemblies, as well as with cartridge assemblies different from the cartridge assemblies described herein. Conversely, the cartridge assemblies of this invention can be used in association with panel receivers other than the panel receiver 91. Also, the module assemblies 11 can be used in association with various different carriers.

Figure 12:
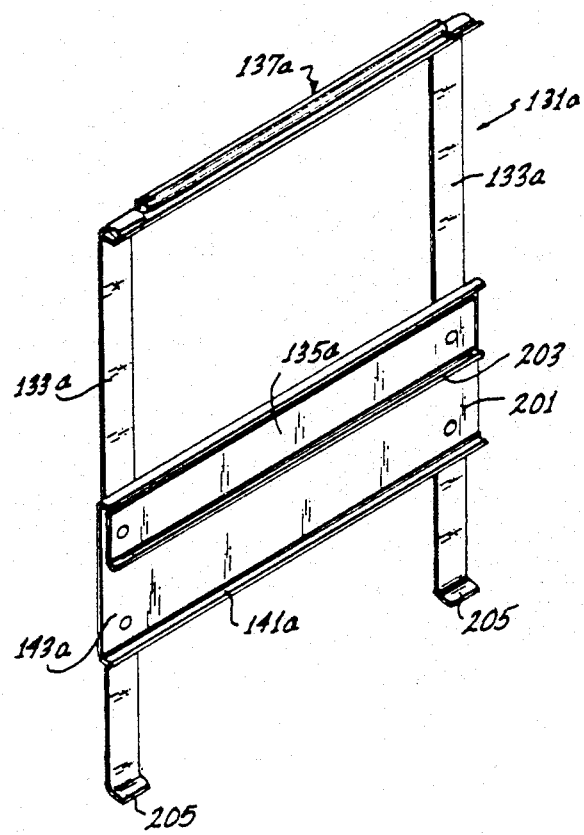
FIG. 12 is a perpective view of another form of elevator.

FIG. 12 shows an elevator 131a which can be incorporated into the panel receiver 91 in lieu of the elevator 131. Portions of the elevator 131a corresponding to portions of the elevator 131 are designated by corresponding reference numerals followed by the letter "a."

The primary difference between the elevators 131 and 131a is that the latter is constructed of metal straps suitably interconnected as by rivets or welding. In addition, the elevator 131a has an additional cross member 201, with the lower edge of the cross member 201 being turned inwardly to provide the shoulder 141a which extends for the full distance between the legs 133a to thereby provide additional lefting surface for the table 7. Similary, the cross member 135a has its lower edge portion turned inwardly to define a broad lower edge 203 for bearing against the upper surface of the table 97. In FIG. 12, the gap 143a is between the shoulder 141a and the edge 203. The lower ends of the legs 133a are turned inwardly to define feet 205 which are adapted to rest on the base plate 107.

Although an exemplary embodiment of the invention has been shown and described, many changes, modifications and substitutions may be made by one having ordinary skill in the art without necessarily departing from the spirit and scope of this invention.

What is claimed is:

1. A module assembly comprising:
   a connector body having a plurality of contact pins mounted thereon and projecting therefrom;
   a flexible sheet having a plurality of conductive contacts and conductive leads thereon with at least some of said leads being electrically coupled to at least some of said contacts;
   means for mounting the flexible sheet on the connector body with at least some of said leads being electrically coupled to at least some of said contact pins and with at least some of said contacts being exposed;
   a pressure member;
   means for coupling the pressure member to the connector body for limited relative movement of the connector boyd and the pressure member toward and away from each other;
   biasing means for resiliently resisting relative movement of the connector body and pressure member toward each other; and
   said pressure member being coupled to only a single one of said connector bodies whereby said relative movement between the pressure member and the connector body is facilitated.

2. An assembly as defined in claim 1 wherein said connector body has a first side, said contact pins project from said first side, said pressure member is on said first side and said contact pins are uncovered by the pressure member.

3. An assembly as defined in claim 1 wherein said connector body has a first side with longitudinal and transverse dimensions and said pressure member is narrower in said transverse dimension than said one side.

4. An assembly as defined in claim 3 wherein said connector body has a second side generally opposite said first side and said flexible sheet extends over at least a portion of said second side.

5. An assembly as defined in claim 1 wherein said connecor body is elongated and has at least one longitudinally extending flange and at least some of said contact pins are mounted on said flange.

6. An assembly as defined in claim 5 wherein said connector body includes a second longitudinally extending flange and a mounting section between said flanges, said pressure member extends generally along said mounting section and some of the contact pins are mounted on the second flange.

7. An assembly as defined in claim 1 wherein the pressure member includes a web extending along the connector body and a plurality of flanges joined to the web and extending away from the connector body in a direction such that squeezing of the module assembly between the flanges and the connector body moves the connector body and the pressure member toward each other against the resilient action of the biasing means.

8. An assembly as defined in claim 1 wherein said coupling means couples the pressure member to the connector body for limited relative pivotal movement about a pluraltiy of mutually perpendicular axes.

9. An assembly as defined in claim 1 wherein said coupling means includes a socket in said connector body for receiving at least a portion of said pressure member and interlocking flanges on the pressure member and the connector body.

10. An assembly as defined in claim 1 wherein said biasing means has compressed and relazed states and said biasing means in allowed to be in said relaxed state by said coupling means.

11. A module assembly comprising:
    a connector body having a plurality of contact pins mounted thereon and projecting therefrom;
    a flexible sheet having a plurality of conductive contacts and conductive leads thereon with at beast some of said leads being electrically coupled to at least some of said contacts;
    means for mounting the flexible sheet on the connector body with at least some of the said leads being electrically coupled to at least some of said contact pins and with at least some of said contacts being exposed;
    a pressure member;
    means for coupling the pressure member to the connector body for limited relative movement of the connector body and the pressure member toward and away from each other;
    biasing means for resiliently resisting relative movement of the connector body and pressure member toward each other; and
    said connector body having a first side, said contact pins projecting from said first side, said pressure member being on said first side and said contact pins being uncovered by the pressure member.

12. An assembly as defined in claim 11 wherein said connector body has a first side with longitudinal and transverse dimension and said pressure member is narrower than said one side in said transverse dimension.

13. An assembly as defined in claim 11 wherein said connector body is elongated and has at least one longitudinally extending flange and at least some of said contact pins are mounted on said flange.

14. An assembly as defined in claim 13 wherein said connector body includes a second longitudinally extending flange and a mounting section between said flanges, said pressure member extends generally along said mounting section and some of the contact pins are mounted on the second flange.

15. A module assembly comprising:
   a connector body having a plurality of contact pins mounted thereon and projecting therefrom;
   a flexible sheet having a plurality of conductive contacts and conductive leads thereon with at least some of said leads being electrically coupled to at least some of said contacts;
   means for mounting the flexible sheet on the connector body with at least some of said leads being electrically coupled to at least some of said contact pins and with at least some of said contacts being exposed;
   a pressure member;
   means for coupling the pressure member to the connector body for limited relative movement of the connector body and the pressure member toward and away from each other;
   biasing means for resiliently resisting relative movement of the connector body and pressure member toward each other; and
   said connector body being elongated and including first and second flanges having first and second groups of said contact pins mounted, respectively, thereon and a mounting section between said first and second groups of contact pins and said pressure member extending generally along said mounting section.

16. An assembly as defined in claim 15 wherein the pressure member includes a web extending along the connector body and a plurality of flanges joined to the web and extending away from the connector body.

17. An assembly as defined in claim 15 wherein said coupled means includes a socket in said connector body for receiving at least a portion of said pressure member and interlocking flanges on the pressure member and the connector body.

18. A module assembly comprising:
   a connector body;
   a sheet having a plurality of conductive contacts and conductive leads thereon, with at least some of said leads being electrically coupled to at least some of said contacts, each of said contacts having a contact area for engaging a contact of another contact-carrying device;
   means for mounting the sheet on the connector body with said contact areas being exposed; and
   first group of said contact being raised contact dots arranged in a first pattern and a second group of said contact being contact pads arranged in a second pattern, and the contact areas of individual ones of said contact pads being larger than the contact areas of individual ones of said contact dots, each of said conductive leads electrically terminating in at least one of said contact dots and one of said contact pads, said contact dots and contacts pads on said sheet being located to engage a substantially matching contact pattern of another contact carrying device with the contact dots and contact pads on the sheet engaging contact pads and contact dots, respectively, on said another device so as to provide electrically redundant contact thereto from each conductive lead so terminated.

19. An assembly as defined in claim 18 wherein a first group of said conductors are arranged in side-by-side relationship and first groups of the contact dots and contact pads are arranged along the first group of conductors, with the contact dots of the first group being in side-by-side relationship and with the contact pads of the first groups being in side-by-side relationship.

20. An assembly as defined in claim 19 wherein the contact dots and the contact pads of the first group are each generally linearly arranged and each of the conductors of the first groups is coupled to at least one of the contact dots of the first group and at least one of the contact pads of the first group.

21. An assembly as defined in claim 18 wherein at least a portion of the sheet is flexible and the module assembly includes a resilient pad between the sheet and the connector body with a portion of the pad extending outwardly of the sheet and means for attaching the sheet to the connector body at said portion of the pad.

22. An assembly as defined in claim 18 including at least one contact pin extending through a portion of the connector body and said sheet and being retained on the connector body by solder, and said mounting means includes a portion of said solder being between the sheet and the connector body.

23. An assembly as defined in claim 22 including a sealant overlying the solder.

24. An assembly as defined in claim 18 including a pressure member, means for coupling the pressure member to the connector body for limited relative movement of the connector body and the pressure member toward and away from each other, and biasing means for resiliently resisting relative movement of the connector body and pressure member toward each other.

25. A cartridge assembly comprising:
   a plurality of individually removable, preassembled, selfcontained module assemblies, each of said module assemblies including a connector body, a plurality of conductive contacts on the connector body, a pressure member mounted on the connector body for limited relative movement toward and away from the connector body, and biasing means confined between said connector body and said pressure member for urging the connector body and pressure member away from each other;
   a carrier having a plurality of pockets therein, each of the pockets having a first opening;
   said module assemblies being received in said pockets with their contacts exposed through said openings; and
   said connector bodies and pressure members being confined in said carrier with the biasing means partially compressed.

26. An assembly as defined in claim 25 wherein said carrier includes a carrier body having said pockets therein, with each of said pockets having a second opening and cover means at least partially covering said second openings, said connector bodies and said pressure members engaging the carrier body and the cover means, respectively, so as to partially compress said biasing means when said cover means is installed on said carrier body.

27. An assembly as defined in claim 26 including coupling means for removably attaching the cover means to the carrier body.

28. An assembly as defined in claim 26 wherein at least some of said module assemblies in a first group of said pockets are adapted to be coupled to cables, and first groups of said second openings forms a common opening for said first group of said pockets and said cover means comprises a cover section partly covering said common opening, with said common opening remaining open sufficiently to allow the passage of the cables therethrough.

29. An assembly as defined in claim 25 wherein at least one of said module assemblies is adapted to be coupled to a cable and the pressure member of said one module assembly includes first and second spaced projections engaging the carrier to partially compress the biasing means and to guide the cable.

30. An assembly as defined in claim 25 including a plunger carried by the carrier and extending outwardly of the carrier on the same side as said first openings and resilient means for urging the plunger outwardly of the carrier.

31. An assembly as defined in claim 30 wherein said carrier includes a carrier body having said pockets therein with each of said pockets having second openings and removable cover means partially covering said second openings, said connector bodies and said pressure members engaging the carrier body and the cover means, respectively, so as to partially compress said biasing means when said cover means is installed on said carrier body.

32. A dual cartridge assembly comprising:
a plurality of module assemblies, each of said module assemblies including connector body, a plurality of conductive contacts on the connector body, a pressure member mounted on the connector body for limited relative movement toward and away from the connector body and biasing means for urging the connector body and pressure member away from each other;
first and second carriers, each of said carriers having a plurality of pockets therein, each of the pockets having a first opening;
first and second groups of said module assemblies being received in the first and second carriers, respectively, with the contact exposed through the openings;
said connector bodies and pressure members engaging the associated carrier with the biasing means being partially compressed; and
means for coupling the first and second carriers together with the contacts of the first and second groups of module assemblies facing outwardly in opposite directions.

33. An assembly as defined in claim 32 wherein said first and second carriers have opposite ends and said coupling means includes first and second plates attached to the opposite ends of the first and second carriers.

34. An assembly as defined in claim 33 including at least one radially opening bearing carried by at least one of said carriers and wherein said first and second plates extend outwardly beyond the first and second carriers.

35. A panel receiver for receiving a cartridge assembly and coupling the cartridge assembly to a test device wherein the cartridge assembly has a plurality of contacts, said panel receiver comprising:
a supporting structure;
a table;
means on the supporing structure for defining a compression member;
means for mounting the table on the supporting structure for movement toward and away from the compression member between extended and retracted position, said table being closer to said compression member in said extended position than in said retracted position;
means defining an array of exposed contacts carried by at least one of the compression member and the table;
said panel receiver having a cartridge assembly receiving space between the compression member and the table for receiving the cartridge assembly when the table is in the retracted position, whereby the contacts on the cartridge assembly can be in confronting relationship with said array of contacts;
cam means engageable with the table at an interface between the cam means and the table for moving the table from the retracted position to the extended position, whereby the contacts of the cartridge assembly can be brought into engagement with said array of contracts;
said cam means including first and second cam shafts mounted on the supporting structure, means for coupling said shafts for pivotal movement of the second shaft about said first shaft and a plurality of rollers carried by each of said first and second cam shafts, a first set of the rollers carried by said second shaft each comprising a bushing rotatably engaging one of the rollers carried by the first shaft, thereby to lift said second shaft as it moves pivotally about said first shaft, and a second set of the rollers carried by said second shaft engaging said table to provide non-sliding movement between said table and said cam means.

36. A receiver as defined in claim 35 wherein said cam shafts are elongated, said panel receiver includes at least three shaft support for mounting the first cam shaft on the supporting structure, said coupling means for said first and second shafts includes a plurality of shaft connectors spaced longitudinally along said first and second cam shafts, said cam means includes a plurality of said bushings engaging a plurality of associated rollers carried by the first cam shaft and said preventing means includes a plurality of said roller spaced apart of the second cam shaft by said bushings and engaging said table.

37. A receiver as defined in claim 35 wherein said table includes a cam actuation bracket engageable by the cam means.

38. A receiver as defined in claim 35 including first and second elevators, means for mounting the first and second elevators on the supporting structure at opposite ends of the cartridge receiving space for movement in the same general direction as the table moves in moving between its extended and retracted position, said elevators having means thereon for supporting the cartridge assembly and being drivable with the table during at least a part of the time that the table is moved toward its extended position.

39. A panel receiver for receiving a cartridge assembly and coupling the cartridge assembly to a test device wherein the cartridge assembly has a plurality of contacts, said panel receiver comprising:
a supporting structure;
a table;
means on the supportion sructure for defining a compression member;
means for mounting the table on the supporting structure for movement toward and away from the compression member between extended and retracted positions, said table being closer to said compression member in said extended position than in said retracted position
means defining an array of exposed contacts carried by at least one of the compression member and the table;
a cartridge asesmbly receiving space between the compression member and the table for receiving the cartridge assembly when the table is in the retracted position, whereby the contacts on the cartridge assembly can be in confronting relationhip with said array of contacts;
first and second elevators, means for mounting the first and second elevators on the supporting structure at opposite ends of the cartridge receiving space for movement in the same general direction as the table moves in moving between its extended and retracted position, said elevators having means thereon for supporting the cartridge assembly and being drivable with the table during at least a part of the time that the table is moved toward its extended position;
means for drivingly coupling the elevators and the table, whereby the table drives the elevators during at least a part of the time that the table is moved toward its extended position;
cam means engageable with the table at an interface between the cam means and the table for moving the table from the retracted position to the extended position, whereby the contacts of the cartridge assembly can be brought into engagement with said array of contacts;
said cam means including means for substantially preventing relative sliding movement between the table and the cam means at said interface when the cam means moves the table from the retracted position to the extended position; and
means for operating said cam means.

40. A receiver as defined in claim 38 including means for drivingly coupling the elevators and the cam means after the table has moved a distance toward its extended position from its retracted position.

41. A receiver as defined in claim 38 including means for drivingly coupling the elevators and the table after the table has moved a distance toward its extended position from its retracted position.

42. A receiver as defined in claim 38 wherein each of said elevators includes a guide rail for guiding and supporting the cartridge assembly.

43. A receiver as defined in claim 35 wherein the cam operating means includes a pivotable handle and magnetic means for releasably retaining the handle in a position in which the table is in the extended position.

44. A receiver as defined in claim 35 wherein the panel receiver is adapted to receive a cartridge assembly with contacts on opposite sides thereof and said array of exposed contacts includes first and second arrays of exposed contacts carried, respectively, by the compression member and the table.

45. A panel receiver for receiving a cartridge assembly and coupling the cartridge assembly to a test device wherein the cartridge assembly has a plurality of contacts, said panel receiver comprising:
a supporting structure;
a table;
means on the supporting structure for defining a compression member;
means for mounting the table on the supporting structure for movement toward and away from the compression member between extended and retracted positions, said table being closer to said compression member in said extended position than in said retracted position;
means defining an array of exposed contacts carried by at least one of the compression member and the table;
said panel receiver having a cartridge assembly receiving space between the compression member and the table for receiving the cartridge assembly when the table is in the retracted position whereby the contacts on the cartridge assembly can be in confronting relationhip with said array of contacts;
means for moving the table from the retracted position to the extended position, whereby the contacts of the cartridge assembly can be brought into engagement with said array of contacts;
first and second elevators; and
means for mounting the first and second elevators on the supporting structure at opposite ends of the cartridge receiving space for movement in the same general direction as the table moves in moving between the extended and retracted positions, said elevators having means thereon for supporting the cartridge assembly thereon and being drivable with the table only after the table has moved a certain distance toward its extended position.

46. A panel receiver for receiving a cartridge assembly and coupling the cartridge assembly to a test device wherein the cartridge assembly has a plurality of contacts, said panel receiver comprising:
a supporting structure;
a table;
means on the supporting structure for defining a compression member;
means for mounting the table on the supporting structure for movement toward and away from the compression member between extended and retracted positions, said table being closer to said compressions member in said extended position than in said retracted positions;
means defining an array of exposed contacts carried by at least one of the compression member and the table;
said panel receiver having a cartridge assembly receiving sapce between the compression member and the table for receiving the cartridge assembly when the table is in the retracted position, whereby the contacts on the cartridge assembly can be in confronting relationship with said array of contacts;
means for moving the table from the retracted position to the extended position, whereby the contacts of the cartridge assembly can be brought into engagement with said array of contacts;
first and second elevators;

means for mounting the first and second elevators on the supporting structure at opposite ends of the cartridge receiving space for movement in the same general direction as the table moves in moving between the extended and retracted positions, said elevators having means thereon for supporting the cartridge assembly thereon and being drivable with the table; and means for drivingly coupling the elevators and the table, whereby the table drives the elevators during at least a part of the time that the table is moved toward the extended position.

47. A receiver as defined in claim 45 including means for drivingly coupling the elevators and the cam means after the table has moved a distance toward its extended position from its retracted position.

48. A receiver as defined in claim 45 including means for drivingly coupling the elevators and the table after the table has moved a distance toward its extended position from its retracted position.

49. A receiver as defined in claim 45 wherein said elevators are drivable with said table when the table has moved a sufficient distance toward its extended position to bring the contacts of said cartridge assembly into engagement with said array of contacts.

50. A method of coupling contacts of a cartridge assembly with an array of contacts of a panel receiver comprising:

supporting a cartridge assembly on first and second elevators at opposite ends of a cartridge receiving space between a compression member and a movable table, with the contacts of the cartridge assembly confronting the array of contacts;

moving the table toward the compression member to move the cartridge assembly off the elevators and toward the compression member; and thereafter moving the elevators toward the compression member to urge the cartridge assembly toward the compression member and to bring the contacts of the cartridge assembly and the array of contacts into tight engagement.

51. A method as defined in claim 50 wherein said step of moving the elevators includes continuing said step of moving the table to engage the elevators with the table and to move the elevators.

* * * * *